United States Patent
Nishisaka

(10) Patent No.: US 9,040,943 B2
(45) Date of Patent: May 26, 2015

(54) CHAMBER AND EXTREME ULTRAVIOLET LIGHT GENERATION APPARATUS

(71) Applicant: GIGAPHOTON INC., Oyama-shi, Tochigi (JP)

(72) Inventor: Toshihiro Nishisaka, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/173,677

(22) Filed: Feb. 5, 2014

(65) Prior Publication Data
US 2014/0217311 A1    Aug. 7, 2014

(30) Foreign Application Priority Data
Feb. 6, 2013 (JP) ................................. 2013-021074

(51) Int. Cl.
*G21K 5/04*    (2006.01)
*H05G 2/00*    (2006.01)

(52) U.S. Cl.
CPC ............... *H05G 2/008* (2013.01); *H05G 2/003* (2013.01)

(58) Field of Classification Search
USPC ................... 250/493.1, 494.1, 495.1, 504 R
See application file for complete search history.

(56) References Cited

U.S. PATENT DOCUMENTS

| 2004/0184014 | A1* | 9/2004 | Bakker et al. | 355/30 |
| 2004/0262541 | A1* | 12/2004 | Honda et al. | 250/492.2 |
| 2008/0258085 | A1* | 10/2008 | Bauer | 250/504 R |

FOREIGN PATENT DOCUMENTS

| JP | 2003-229298 A | 8/2003 |
| JP | 2012-109218 A | 6/2012 |

* cited by examiner

*Primary Examiner* — Nicole Ippolito
(74) *Attorney, Agent, or Firm* — McDermott Will & Emery LLP

(57) ABSTRACT

A chamber used in an extreme ultraviolet light generation apparatus that generates extreme ultraviolet light by irradiating a target material with a laser beam may include a chamber receptacle, a heat shield that is disposed within the chamber receptacle between a predetermined region where the target material turns into plasma and the chamber receptacle and that is configured to absorb heat produced at the predetermined region when the target material turns into plasma, and a support portion configured to attach the heat shield to the chamber receptacle, and further, the support portion may include an absorbing portion configured to absorb stress produced in the heat shield deforming due to the heat, by expanding/contracting in response to the thermal deformation of the heat shield.

7 Claims, 11 Drawing Sheets

CHAMBER AND EXTREME ULTRAVIOLET LIGHT GENERATION APPARATUS

CROSS-REFERENCE TO A RELATED APPLICATION

The present application claims priority from Japanese Patent Application No. 2013-021074 filed Feb. 6, 2013.

BACKGROUND

1. Technical Field

The present invention relates to chambers and extreme ultraviolet (EUV) light generation apparatuses.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An aspect of the present invention may be a chamber used in an extreme ultraviolet light generation apparatus that generates extreme ultraviolet light by irradiating a target material with a laser beam, the chamber including a chamber receptacle, a heat shield, and a support portion. The heat shield may be disposed within the chamber receptacle between a predetermined region where the target material turns into plasma and the chamber receptacle and may be configured to absorb heat produced at the predetermined region when the target material turns into plasma. The support portion may be configured to attach the heat shield to the chamber receptacle. At least one of the heat shield and the support portion may include an absorbing portion configured to absorb stress produced in the heat shield deforming due to the heat, by expanding/contracting in response to the thermal deformation of the heat shield.

Another aspect of the present invention may be a chamber used in an extreme ultraviolet light generation apparatus that generates extreme ultraviolet light by irradiating a target material with a laser beam, the chamber including a chamber receptacle, a heat shield, and a support portion. The heat shield may be disposed within the chamber receptacle between a predetermined region where the target material turns into plasma and the chamber receptacle and may be configured to absorb heat produced at the predetermined region when the target material turns into plasma. The support portion may be configured to attach the heat shield to the chamber receptacle. The heat shield may be cylindrical in shape and extend from a laser beam entry side to an extreme ultraviolet light output side. The heat shield may include a slot that extends from one end of the heat shield to the other end of the heat shield and that is configured to expand/contract in response to the thermal deformation of the heat shield.

BRIEF DESCRIPTION OF THE DRAWINGS

Hereinafter, selected embodiments of the present disclosure will be described with reference to the accompanying drawings.

DETAILED DESCRIPTION

Figure 1:
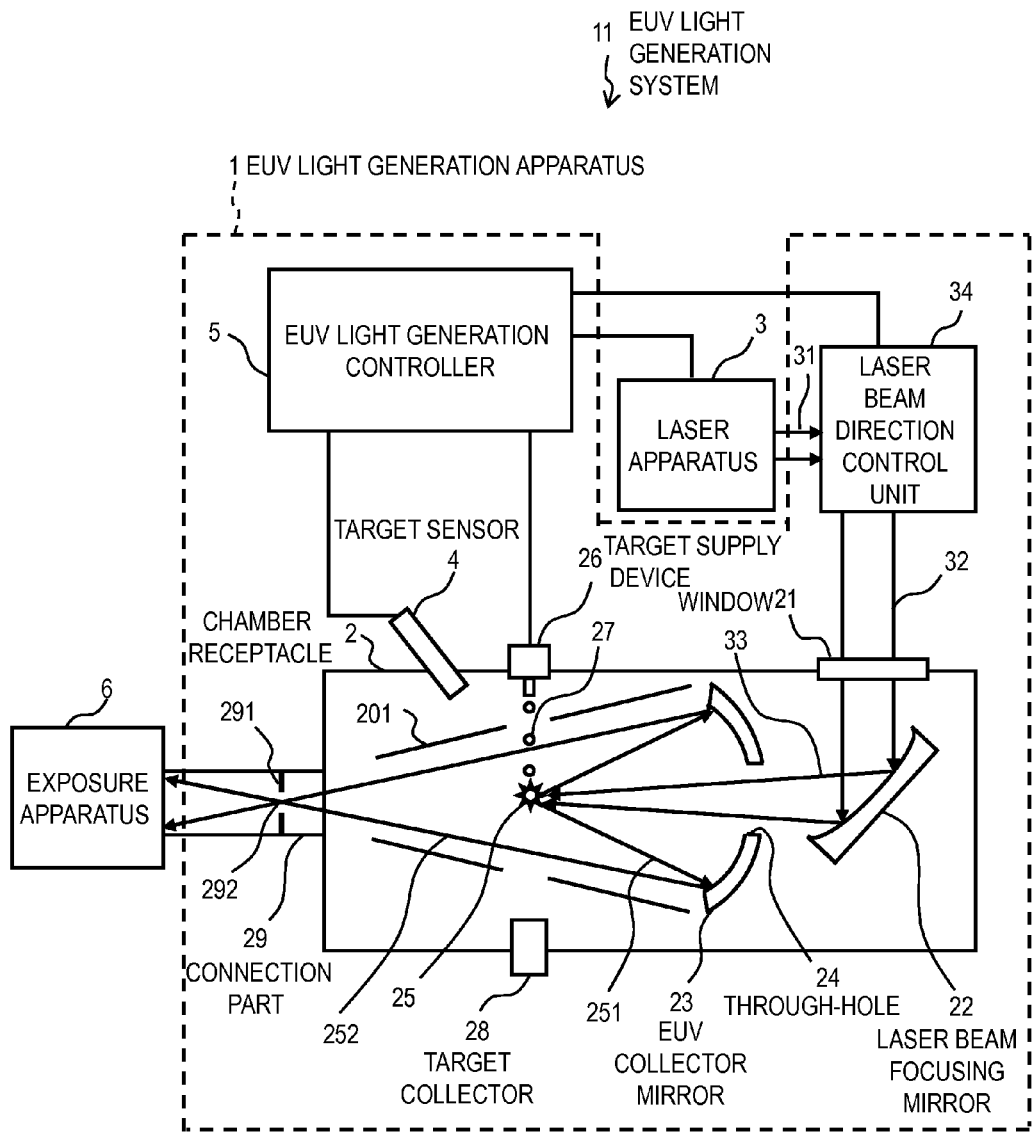
FIG. 1 illustrates the overall configuration of an exemplary LPP type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
Suppression of Thermal Strain of Chamber
2. Terms
3. Overview of EUV Light Generation System 3.1 Configuration
3.2 Operation
4. EUV Light Generation Apparatus Including Heat Shield
4.1 Configuration
4.2 Operation
4.3 Effect
5. Variations on Chamber Configuration
5.1 First Embodiment
5.2 Second Embodiment
5.3 Third Embodiment
5.4 Fourth Embodiment
5.5 Fifth Embodiment
5.6 Sixth Embodiment
5.7 Seventh Embodiment
6. Other Configuration Example of EUV Light Generation Apparatus Including Heat Shield 1. Overview An LPP (laser produced plasma) type extreme ultraviolet (EUV) light generation apparatus may generate EUV light by supplying a target material to a plasma generation region within a chamber receptacle, irradiating a target with a laser beam, and turning the target into plasma. The generated EUV light may be focused by an EUV collector mirror disposed within the chamber receptacle, and may be supplied to an exposure apparatus or the like.

The chamber receptacle can experience thermal deformation upon absorbing radiant light from the plasma and scattered laser light. Thermal deformation in the chamber receptacle can cause the positions of devices anchored to the chamber receptacle to change. For example, there are cases where a target material supply device, the EUV collector mirror, and the like are anchored to the chamber receptacle. When the positions, orientations, and so on of these devices change due to thermal deformation in the chamber receptacle, the positions of a plasma emission point or an intermediate focus point IF can change. In this case, it can be difficult to output EUV light that meets the requirements of the exposure apparatus.

Accordingly, according to a first aspect of the present disclosure, a heat shield that absorbs radiant light from plasma and scattered laser light may be disposed within a chamber receptacle used in an LPP type EUV light generation apparatus. The heat shield can reduce thermal deformation in the chamber receptacle caused by the radiant light from plasma and the scattered laser light.

Furthermore, the heat shield may be supported in the chamber receptacle by a support portion. At least one of the heat shield and the support portion may include an absorbing portion that absorbs stress produced by thermal deformation in the heat shield. Through this, a large stress caused by thermal deformation in the heat shield can be prevented from being transmitted to the chamber receptacle, and the stability of the shape of the chamber receptacle and the positions of the devices anchored thereto can be improved.

2. Terms

Several terms used in the present specification will be described hereinafter. A "chamber receptacle" is a receptacle, in an LPP type EUV light generation apparatus, that is used to isolate a space in which plasma is generated from the exterior. A "chamber" is a component of the EUV light generation apparatus, configured of the chamber receptacle and associated components, that includes at least the chamber receptacle, a heat shield within the chamber receptacle, and a support portion that connects the chamber receptacle to the heat shield and supports the heat shield.

A "target supply device" is a device for supplying a target material that is used for generating EUV light, such as tin, to the interior of the chamber receptacle. The target material outputted by the target supply device may be outputted as droplets, a continuous stream, a particle stream, or the like. An "EUV collector mirror" is a mirror for reflecting EUV light radiated from plasma and outputting that light to the exterior of the chamber receptacle.

3. Overview of EUV Light Generation System 3.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber receptacle 2 and a target supply device 26. The chamber receptacle 2 may be sealed airtight. The target supply device 26 may be mounted onto the chamber receptacle 2, for example, to penetrate a wall of the chamber receptacle 2. A target material to be supplied by the target supply device 26 may include, but is not limited to, tin, terbium, gadolinium, lithium, xenon, or any combination thereof.

The chamber receptacle 2 may have at least one through-hole or opening formed in its wall, and a pulse laser beam 32 may travel through the through-hole/opening into the chamber receptacle 2. Alternatively, the chamber receptacle 2 may have a window 21, through which the pulse laser beam 32 may travel into the chamber receptacle 2. An EUV collector mirror 23 having a spheroidal surface may, for example, be provided in the chamber receptacle 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

A heat shield 201 may be disposed within the chamber receptacle 2. The heat shield 201 may absorb heat produced by radiant light from plasma, scattered laser light, and the like. Accordingly, thermal deformation in the chamber receptacle 2 caused by absorption of the radiant light from plasma and the scattered laser light can be reduced.

The EUV light generation system 11 may further include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber receptacle 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

3.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber receptacle 2. The pulse laser beam 32 may travel inside the chamber receptacle 2 along at least one beam path from the laser apparatus 3, be reflected by the laser beam focusing mirror 22, and strike at least one target 27 as a pulse laser beam 33.

The target supply device 26 may be configured to output the target(s) 27 toward the plasma generation region 25 in the chamber receptacle 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

4. EUV Light Generation Apparatus Including Heat Shield

4.1 Configuration

Figure 2:
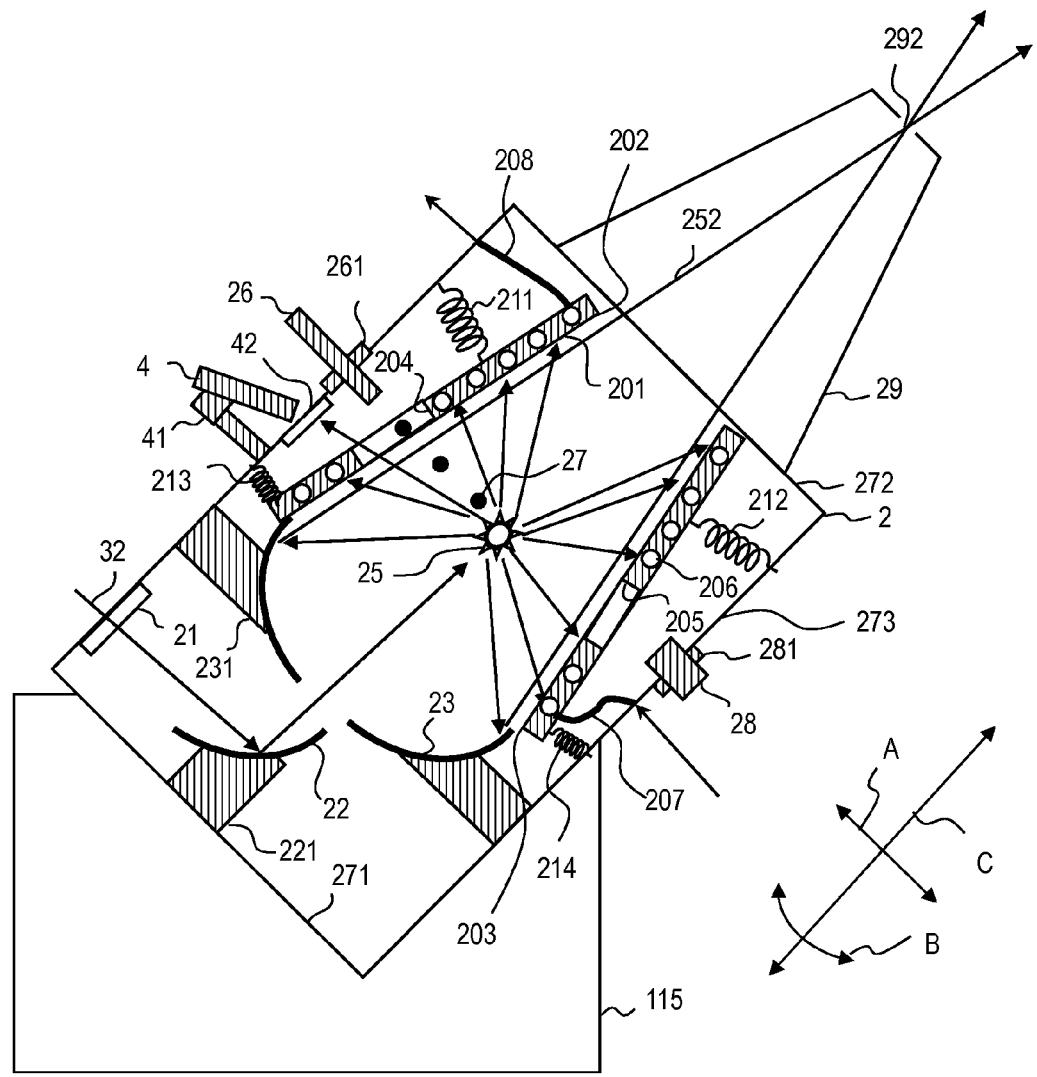
FIG. 2 is a schematic cross-sectional view illustrating part of the configuration of an EUV light generation apparatus according to a first embodiment.

FIG. 2 is a schematic cross-sectional view illustrating part of the configuration of the EUV light generation apparatus 1 according to a first embodiment. FIG. 2 schematically illustrates the chamber receptacle 2 and constituent elements supported therein. In FIG. 2, directions A, B, and C indicate a radial direction, a circumferential direction, and a center axis direction of a cylinder serving as the chamber receptacle 2.

The chamber receptacle 2 may be configured so that an inner space where EUV light is generated is sealed airtight. A component that isolates the inner space of the chamber receptacle 2 from the atmosphere may be attached in an airtight state so that the interior of the chamber receptacle 2 is kept at a low pressure. The interior of the chamber receptacle 2 may be held at a predetermined pressure (a lower pressure than atmospheric pressure).

The chamber receptacle 2 may be anchored to a support platform 115, tilted at a predetermined angle from a vertical direction (the up-down direction in FIG. 2). The chamber receptacle 2 may have a cylindrical shape, and may be formed as a circular cylinder or a rectangle cylinder, for example. In the case where the chamber receptacle 2 is a circular cylinder, the inner diameter thereof need not be constant along the center axis direction of the cylinder.

The cylindrical chamber receptacle 2 may include walls 271 and 272 that are perpendicular to the cylinder center axis and a side wall 273 that extends along the cylinder center axis. The wall 271 of the cylindrical chamber receptacle 2 may be a solid wall that does not have any holes, or may be a wall having a hole for allowing a laser beam to pass through. The wall 272 may be a wall having a hole for allowing EUV light to pass through. As another example, the wall 271 may have a hole, and the wall 271 may be replaced by a constituent element that is separate from the chamber receptacle 2. Furthermore, the wall 272 may not be present.

As shown in FIG. 2, the laser beam focusing mirror 22 may be attached to the inside of the chamber receptacle 2 using a holder 221. The holder 221 may connect the laser beam focusing mirror 22 and an inner surface of the wall 271 to each other, and may anchor the laser beam focusing mirror 22 within the chamber receptacle 2.

The EUV collector mirror 23 may be attached to the inside of the chamber receptacle 2 using a holder 231. The holder 231 may connect the EUV collector mirror 23 and an inner surface of the side wall 273 to each other, and may anchor the EUV collector mirror 23 within the chamber receptacle 2.

The target supply device 26, which is a target material generation device, may be attached to the chamber receptacle 2 using a holder 261. The holder 261 may connect the target supply device 26 and the side wall 273 to each other, and may anchor the target supply device 26 to the side wall 273. The target collector 28 may be attached to the chamber receptacle 2 using a holder 281. The holder 281 may connect the target collector 28 to the side wall 273, and may anchor the target collector 28 to the chamber receptacle 2 on the opposite side to the side on which the target supply device 26 is attached.

The target sensor 4 may be attached to the chamber receptacle 2 using a holder 41. The holder 41 may connect the target sensor 4 and the side wall 273 to each other, and may anchor the target sensor 4 to the side wall 273. In the case where the target sensor 4 is an imaging device, the target sensor 4 may be attached at a position from which the targets 27 can be observed. The target sensor 4 may detect at least one of the presence, trajectory, and position of the target material using light passing through a window 42 that is anchored to the side wall 273.

The aforementioned positions of the devices attached to the chamber receptacle 2 are not limited to the above examples. The aforementioned devices may be attached at other positions in accordance with the design of the EUV light generation apparatus 1.

As shown in FIG. 2, the heat shield 201 may be attached within the chamber receptacle 2 using support portions 211, 212, 213, and 214. One or a plurality of support portions may connect the heat shield 201 and an inner wall of the chamber receptacle 2 to each other.

The heat shield 201 may have a cylindrical shape. The heat shield 201 may include a through-hole (upper-end hole) 202 and a through-hole (lower-end hole) 203, and may be a cylinder configured of a side wall. The heat shield 201 may extend from the EUV collector mirror 23 toward the chamber wall 272 (a direction in which EUV light travels). For example, a cylinder center axis of the cylindrical heat shield 201 may match a line connecting the plasma generation region 25 to the IF 292. The heat shield 201 may include walls that partially cover the through-holes 202 and 203 as long as those walls do not block the EUV light used for exposure.

The heat shield 201 may be disposed between the plasma generation region 25 and the chamber receptacle 2. A space surrounded by the heat shield 201 (an inner space) may contain the plasma generation region 25, and may contain at least part of the space between the EUV collector mirror 23 and the chamber wall 272.

Part of the heat shield 201 may overlap with the EUV collector mirror 23 when viewed from the radial direction (the direction A in FIG. 2), and part or all of the EUV collector mirror 23 may be contained within the inner space of the heat shield 201. An end of the heat shield 201 toward the EUV collector mirror 23 (a bottom end) may be disposed in a space that is closer to the chamber wall 272 than the EUV collector mirror 23, and all of the EUV collector mirror 23 may be located outside the inner space of the heat shield 201.

As shown in FIG. 2, the heat shield 201 may be a circular truncated cone-shaped cylinder. A diameter of the through-hole hole 202 may be smaller than a diameter of the through-hole hole 203. The diameter of the heat shield 201 may decrease in a linear manner along a direction in which the EUV light travels, within a range that does not block the EUV light reflected by the EUV collector mirror 23. As another example, the diameter of the heat shield 201 may be constant. The heat shield 201 may be formed as a circular cylinder, an elliptical cylinder, or a rectangle cylinder, for example.

The heat shield 201 may include through-holes formed in a side surface thereof. The through-holes may be two through-holes 204 and 205, for example. The through-hole 204 may be a hole through which the target 27 discharged from the target supply device 26 toward the plasma generation region 25 passes. The target sensor 4 may detect the position and so on of the target 27 using light passing through the through-hole 204.

The through-hole 205 may be formed on the opposite side to the through-hole 204. The through-hole 205 may be a hole through which the targets 27 that are collected in the target collector 28 pass.

The heat shield 201 may include a coolant channel 206. The coolant channel 206 may be formed within the side wall of the heat shield 201, in a spiral shape. The heat shield 201 may be formed of the same material as the chamber receptacle or of a different material. The heat shield 201 may be formed of a metal, and may be formed of aluminum, for example.

A coolant introduction tube 207 may be connected between an outer surface of the chamber receptacle 2 and an entrance to the coolant channel 206. Thermal deformation of the heat shield 201 is suppressed by a coolant. A coolant discharge tube 208 may be connected between an outer surface of the chamber receptacle 2 and an exit from the coolant channel 206. The coolant introduction tube 207 and the coolant discharge tube 208 may be flexible tubes having an accordion shape, for example.

The coolant introduction tube 207 and the coolant discharge tube 208 may be connected to an external pump and a heat exchanger unit (not shown). The coolant, such as water, discharged from the coolant discharge tube 208 may be cooled in the heat exchanger unit, and may then be sent to the coolant channel 206 via the coolant introduction tube 207 by the pump.

The support portions 211 and 212 may be attached on an outer side of the heat shield 201 and an inner side of the chamber receptacle 2, in a location near the IF 292 (that is, on the EUV light output side). The support portions 213 and 214 may be attached to an outer side of the heat shield 201 and an inner side of the chamber receptacle 2, in a location near the EUV collector mirror 23 (that is, on the laser beam input side). The support portions 211 to 214 may be capable of expanding/contracting in response to thermal deformation in the heat shield 201, and may absorb stress produced by thermal deformation in the heat shield 201. The support portions 211 to 214 may, for example, include elastic members that elastically deform in response to thermal deformation in the heat shield 201.

4.2 Operation

The target supply device 26 may discharge the target 27 toward the plasma generation region 25 within the chamber receptacle 2, and the target 27 may pass through the through-hole 204 in the heat shield 201. The pulse laser beam 32 that enters into the chamber receptacle 2 via the window 21 and is reflected by the laser beam focusing mirror 22 may strike the target 27 at the plasma generation region 25.

The target 27 that has been struck by the pulse laser beam 32 may be turned into plasma at the plasma generation region 25, and the EUV light 251 generated thereby may be reflected and focused by the EUV collector mirror 23. The EUV light 252 reflected by the EUV collector mirror 23 may be outputted through the IF 292.

Radiant light is produced from the plasma at the plasma generation region 25, and the pulse laser beam 32 that was not used to excite the target 27 is scattered. The heat shield 201 may absorb the radiant light from the plasma generation region 25 and the scattered light from the pulse laser beam 32, and may reduce the amount of light that reaches the chamber receptacle 2. This reduces the amount of radiant light, scattered laser light, and so on absorbed by the chamber receptacle 2, and thus the chamber receptacle 2 can be suppressed from heating up as a result of absorbing light.

The heat shield 201 that has absorbed the radiant light, the scattered laser light, and so on can heat up and thermally expand. The coolant may be flowing within the coolant channel 206 of the heat shield 201. The coolant can absorb heat from the heat shield 201 and reduce the temperature thereof. As a result, the amount of thermal deformation in the heat shield 201 and the amount of heat radiated from the heat shield 201 to the chamber receptacle 2 can be reduced.

The support portions 211 to 214 may expand/contract in accordance with the deformation in the heat shield 201. The support portions 211 to 214 may contract when the heat shield 201 thermally expands. The support portions 211 to 214 may expand when the heat shield 201 contracts.

Due to the movement of the support portions 211 to 214, the support portions 211 to 214 may absorb stress resulting from the expansion/contraction of the heat shield 201. As a result, stress caused by thermal deformation in the heat shield 201 can be suppressed from being transmitted to the chamber receptacle 2.

4.3 Effect

When the chamber receptacle 2 heats up, expands, and deforms due to radiant light from the plasma, scattered laser light that was not used to excite the target material, and so on, the positions of devices attached to the chamber receptacle 2 can change.

For example, in the case where the target supply device 26 is supported by the chamber receptacle 2, the position and orientation of the target supply device 26 can change due to deformation in the chamber receptacle 2, and the targets can become unable to be supplied to the plasma generation region 25 with precision.

Alternatively, in the case where the target sensor 4 is supported by the chamber receptacle 2, the position and orientation of the target sensor 4 can change due to deformation in the chamber receptacle 2, and a positional relationship between the plasma generation region 25 and the trajectory of the targets 27 may become unable to be detected with precision.

Further still, in the case where the EUV collector mirror 23 is supported by the chamber receptacle 2, the position and orientation of the EUV collector mirror 23 can change due to deformation in the chamber receptacle 2, and the EUV light can become unable to be focused at the IF 292.

By absorbing the radiant light from the plasma, the scattered laser light, and so on, the heat shield 201 may make it difficult for the chamber receptacle 2 to be directly exposed to the radiant light from the plasma, the scattered laser light, and so on. Accordingly, thermal deformation of the chamber receptacle 2 can be suppressed.

The heat shield 201 that has absorbed the radiant light from the plasma, the scattered laser light, and so on may thermally deform. However, even if the heat shield 201 thermally deforms, the heat shield 201 may be supported by the support portions 211 to 214 that contract/expand in accordance with the expansion/contraction of the heat shield 201. Accordingly, deformation in the chamber receptacle 2 caused by thermal deformation in the heat shield 201 can be suppressed. As a result, the positions and orientations of the laser beam focusing mirror 22, the EUV collector mirror 23, the target supply device 26, the target sensor 4, and so on can be stabilized, and the positions of the plasma generation region 25 and the IF 292 as well as the output direction of the EUV light can be stabilized as well.

Note that at least some of the laser beam focusing mirror 22, the EUV collector mirror 23, the target supply device 26, and the target sensor 4 may not be anchored to the chamber receptacle 2, and the chamber receptacle 2 may not be the component that serves as the mounting position reference of those elements. For example, the stated elements may be attached to a member that is anchored outside the chamber receptacle 2. Furthermore, the heat shield 201 may not be cooled by a coolant. The same applies to the other embodiments that will be described hereinafter.

5. Variations on Chamber Configuration

5.1 First Embodiment

Figure 3A:
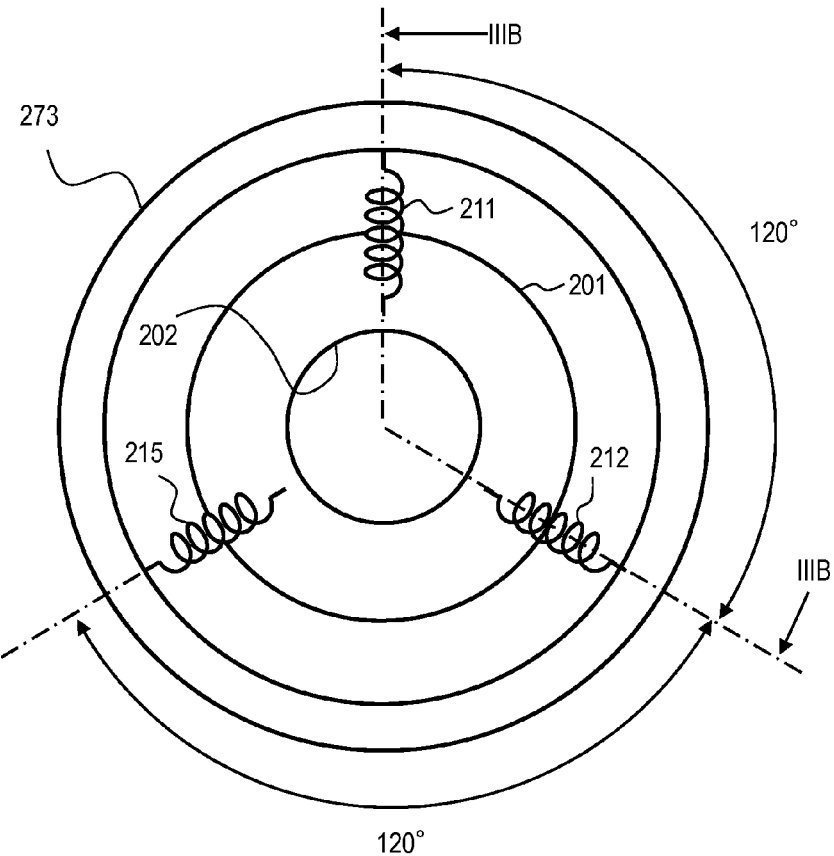
FIG. 3A schematically illustrates the configuration of a chamber according to the first embodiment.
Figure 3B:
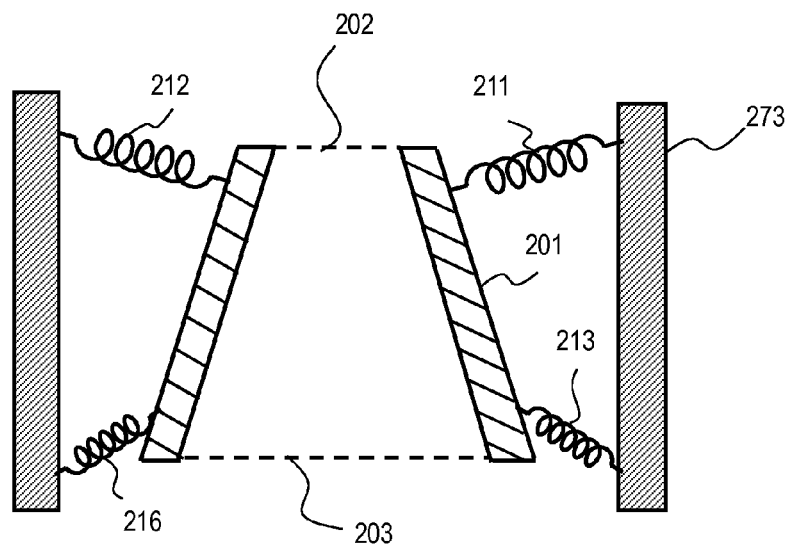
FIG. 3B is a cross-sectional view taken along a IIIB-IIIB cutting line shown in FIG. 3A.

FIGS. 3A and 3B schematically illustrate the configuration of a chamber including the chamber receptacle 2, the heat shield 201, and support portions that are anchored thereto and support the heat shield 201. FIG. 3A illustrates the configuration as seen from the side on which the IF 292 is located, whereas FIG. 3B is a cross-sectional view of the chamber taken along a cutting line IIIB-IIIB shown in FIG. 3A.

As shown in FIGS. 3A and 3B, the heat shield 201 may be a single continuous cylindrical member. The heat shield 201 may be supported by six support portions 211 to 216 that expand/contract. The six support portions 211 to 216 may be attached to an outer surface of the heat shield 201 and an inner surface of the side wall 273 of the chamber receptacle 2. The heat shield 201 may be supported on the side wall 273 only by the six support portions 211 to 216.

Three support portions 211, 212, and 215 and the other three support portions 213, 214, and 216 may be anchored to the outer surface of the heat shield 201, at different positions in the cylinder center axis direction of the heat shield 201. The three support portions 211, 212, and 215 may support a side of the heat shield 201 located toward the through-hole 202 (toward the IF 292), whereas the other three support portions 213, 214, and 216 may support a side of the heat shield 201 located toward the through-hole 203 (toward the EUV collector mirror 23). Through this, it may be possible to support the heat shield 201 in a stable manner.

The three support portions 211, 212, and 215 and the other three support portions 213, 214, and 216 may be anchored to the inner surface of the side wall 273 of the chamber receptacle 2, at different positions in the cylinder center axis direction of the chamber receptacle 2. The three support portions 211, 212, and 215 may be anchored to the side of the inner surface of the chamber receptacle 2 toward the IF 292, whereas the other three support portions 213, 214, and 216 may be anchored to the side of the inner surface of the chamber receptacle 2 toward the EUV collector mirror 23.

As shown in FIG. 3B, the positions at which the support portions 211, 212, and 215 are anchored to the outer surface of the heat shield 201 may be the same in the cylinder center axis direction. The positions at which the support portions 211, 212, and 215 are anchored to the chamber receptacle 2 may be the same or different in the cylinder center axis direction of the heat shield 201. The same may apply to the support portions 213, 214, and 216.

As shown in FIG. 3A, the three support portions 211, 212, and 215 may be anchored to the outer surface of the heat shield 201 at equal intervals (120°) along the circumferential direction thereof. Through this, it may be possible to support the heat shield 201 in a stable manner. Meanwhile, the support portions 211, 212, and 215 may be anchored to the inner surface of the side wall 273 of the chamber receptacle 2 at equal intervals along the circumferential direction thereof. The same may apply to the support portions 213, 214, and 216.

When the heat shield 201 expands due to radiant light from the plasma, scattered laser light, or the like, the support portions 211 to 216 absorb stress caused by thermal deformation in the heat shield 201 by contracting, and can therefore reduce a resulting force that is transmitted to the chamber receptacle 2. When the heat shield 201 contracts, the support portions 211 to 216 can expand so as to absorb stress caused by the heat shield 201 contracting, and can therefore reduce a resulting force that is transmitted to the chamber receptacle 2. A direction in which the support portions 211 to 216 expand/contract may contain components that are both parallel and perpendicular to the radial direction of the heat shield 201.

5.2 Second Embodiment

Figure 4A:
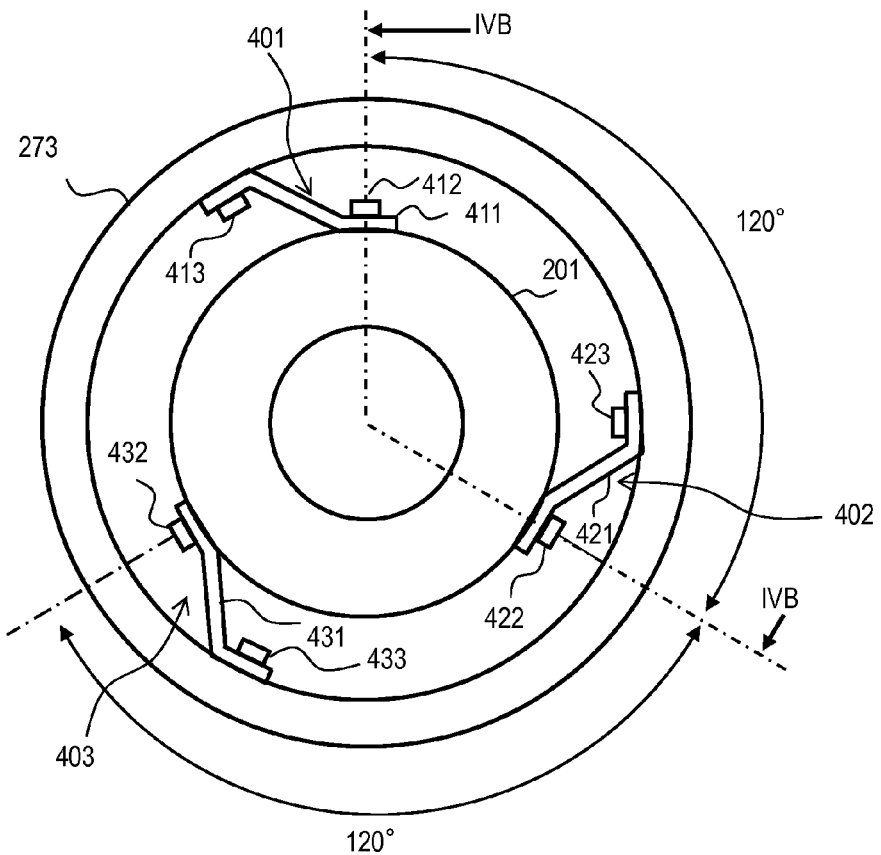
FIG. 4A schematically illustrates the configuration of a chamber according to a second embodiment.
Figure 4B:
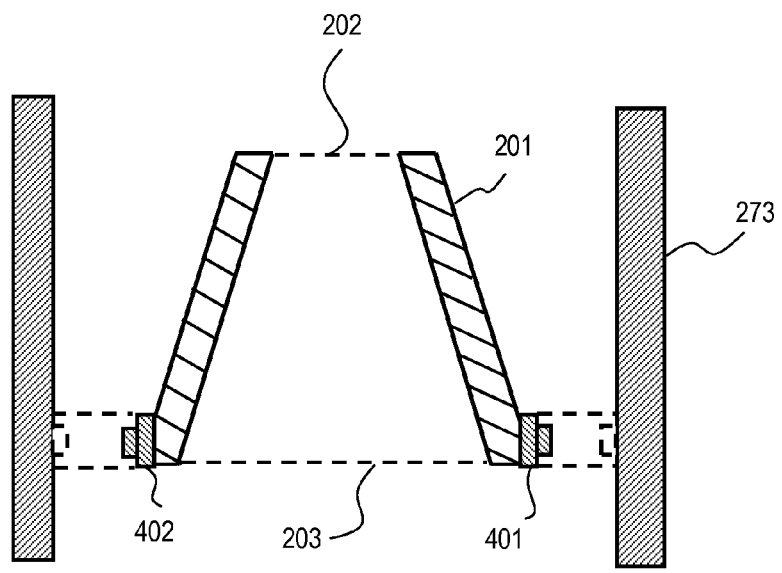
FIG. 4B is a cross-sectional view taken along a IVB-IVB cutting line shown in FIG. 4A.

FIGS. 4A and 4B schematically illustrate a chamber configuration according to a second embodiment. FIG. 4A illustrates the configuration as seen from the side on which the IF 292 is located, whereas FIG. 4B is a cross-sectional view of the chamber taken along a cutting line IVB-IVB shown in FIG. 4A. The following descriptions will focus primarily on points that are different from the configuration having been described with reference to FIGS. 3A and 3B.

As shown in FIG. 4A, the heat shield 201 may be supported by three support portions 401 to 403. The positions at which the support portions 401 to 403 are anchored to the outer surface of the heat shield 201 may be the same in the cylinder center axis direction of the heat shield 201. As shown in FIG. 4B, the positions at which the support portions 401 to 403 are anchored to the chamber receptacle 2 may be the same in the cylinder center axis direction of the heat shield 201.

The support portion 401 may include a plate spring 411 and anchoring screws 412 and 413. The anchoring screw 412 may anchor an end of the plate spring 411 to the heat shield 201. The anchoring screw 413 may anchor the other end of the plate spring 411 to the chamber receptacle 2.

The support portion 402 may include a plate spring 421 and anchoring screws 422 and 423. The anchoring screw 422 may anchor an end of the plate spring 421 to the heat shield 201. The anchoring screw 423 may anchor the other end of the plate spring 421 to the chamber receptacle 2.

The support portion 403 may include a plate spring 431 and anchoring screws 432 and 433. The anchoring screw 432 may anchor an end of the plate spring 431 to the heat shield 201. The anchoring screw 433 may anchor the other end of the plate spring 431 to the chamber receptacle 2.

As shown in FIG. 4A, the three support portions 401 to 403 (that is, the anchoring screws 412, 422, and 432) may be anchored to the outer surface of the heat shield 201 at equal intervals (120°) along the circumferential direction thereof. The heat shield 201 can be supported in a stable manner as a result. Meanwhile, the support portions 401 to 403 (that is, the anchoring screws 413, 423, and 433) may be anchored to the inner surface of the side wall 273 of the chamber receptacle 2 at equal intervals along the circumferential direction thereof. However, the support portions 401 to 403 may be anchored to the heat shield 201 and/or the chamber receptacle 2 at intervals that are not equal along the circumferential directions thereof.

As shown in FIG. 4A, the plate spring 411 may be configured of a single bent metal plate (for example, a stainless steel plate) that expands/contracts as a spring in the radial direction of the heat shield 201. However, the plate spring 411 may be configured of a plurality of bent plates. The same may apply to the plate springs 421 and 431.

As the heat shield 201 thermally deforms due to radiant light from the plasma, scattered laser light, or the like, the plate springs 411, 421, and 431 can absorb stress produced by the thermal deformation in the heat shield 201 by expanding/contracting in the radial direction of the heat shield 201, and can reduce a force transmitted to the chamber receptacle 2 as a result. In this manner, the absorbing portion that absorbs stress produced by thermal deformation in the heat shield 201 may include a plate spring.

Note that the plate springs 411, 421, and 431 may expand/contract in the radial direction of the heat shield 201, but may not expand/contract in the cylinder center axis direction of the heat shield 201. In the second embodiment, the heat shield 201 may not be confined to the chamber receptacle 2 in the cylinder center axis direction thereof. Accordingly, the heat shield 201 thermally deforming in that direction may not result in deformation that will pose a problem to the chamber receptacle 2.

The plate springs 411, 421, and 431 may be anchored to the inner surface of the heat shield 201. The plate springs 411, 421, and 431 may extend from within the heat shield 201 to the inner surface of the chamber receptacle 2 while bending.

The plate springs 411, 421, and 431 may be anchored to the heat shield 201 and the chamber receptacle 2 using a different means from screws. For example, the plate springs may be anchored using rivets, welding, or the like. The heat shield 201 may be supported by four or more support portions, including the support portions 401 to 403, that are anchored to positions along the same circle. Furthermore, different types of springs from plate springs may be used.

5.3 Third Embodiment

Figure 5A:
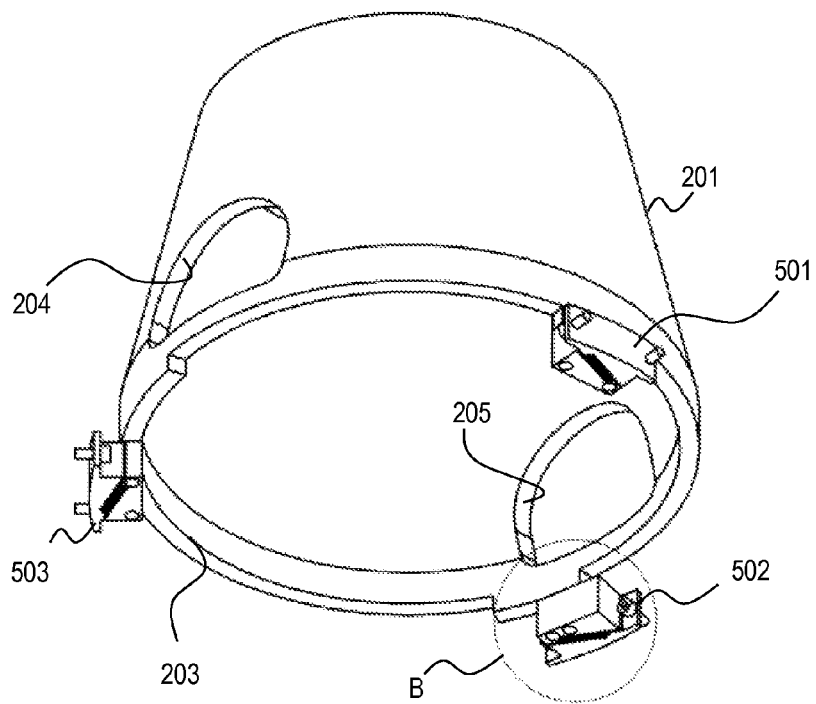
FIG. 5A schematically illustrates the configuration of a heat shield and a support portion in a chamber according to a third embodiment.
Figure 5B:
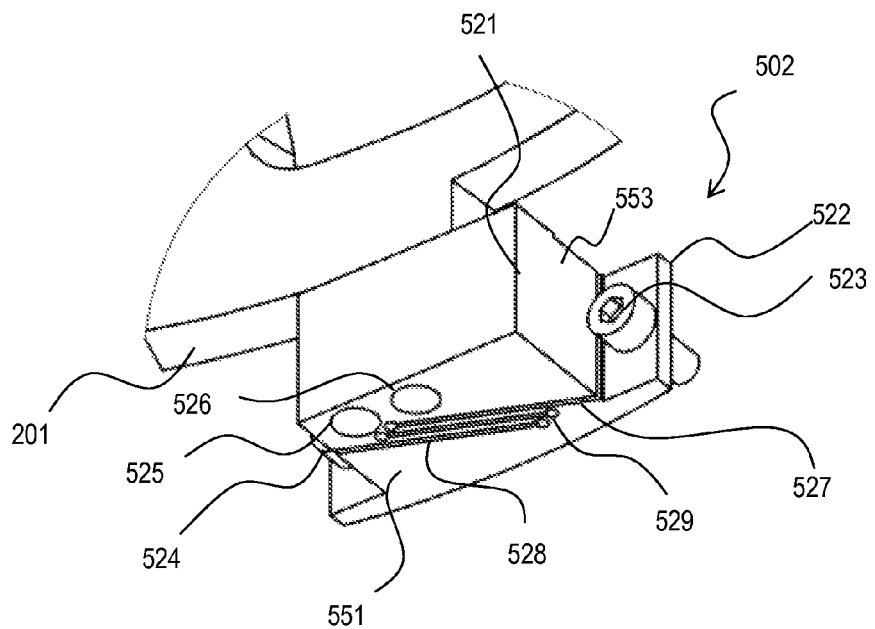
FIG. 5B illustrates an area in FIG. 5A within a circle B in an enlarged manner.

FIGS. 5A and 5B schematically illustrate the configuration of a heat shield and support portions in a chamber according to a third embodiment. FIG. 5A is a perspective view taken from the side on which the EUV collector mirror 23 is located, whereas FIG. 5B illustrates an area in FIG. 5A within a circle B in an enlarged manner. The following descriptions will focus primarily on points that are different from the configuration having been described with reference to FIGS. 4A and 4B.

As shown in FIG. 5A, the heat shield 201 may be supported by three support portions 501 to 503. The positions at which the support portions 501 to 503 are anchored to the heat shield 201 may be the same in the cylinder center axis direction on an end surface of the heat shield 201 located toward the EUV collector mirror 23 (that is, a bottom end surface). The end surface may be an outer surface of the heat shield 201. The positions at which the support portions 501 to 503 are anchored to the heat shield 201 and the chamber receptacle 2 may be the same in the cylinder center axis direction of the heat shield 201.

The configuration of the support portion 502 will be described with reference to FIG. 5B. The support portions 501 and 503 may have the same configuration as the support portion 502. As shown in FIG. 5B, the support portion 502 may include a body portion 521, a flange portion 522, anchoring screws 523 and 524, anchoring screw through-holes 525 and 526, grooves 527 and 528, and a through-hole 529. The support portion 502 may be formed of a metal such as aluminum or stainless steel.

The anchoring screws 523 and 524 may be inserted into through-holes formed in the flange portion 522, and may anchor the support portion 502 to the inner surface of a side wall of the chamber receptacle 2.

The anchoring screw through-holes 525 and 526 may be formed in the hexahedral body portion 521, and may be holes for containing anchoring screws (not shown) that anchor the support portion 502 to the heat shield 201. The anchoring screw through-holes 525 and 526 may extend from a bottom surface 551 of the body portion, to a surface on the opposite side thereof. The anchoring screw through-holes 525 and 526 may be counter sunk holes, and may be formed having a constant diameter a up to a set depth from the bottom surface 551 of the body portion and a diameter 13, which is smaller than $\alpha$ ($\beta<\alpha$), from the set depth to the surface on the opposite side. For example, the anchoring screw through-holes 525 and 526 may pass through the body portion 521 in a direction that follows the side wall 273 of the chamber receptacle 2 and that is perpendicular to the circumferential direction of the heat shield 201.

The grooves 527 and 528 and the through-hole 529 may be formed in the body portion 521. Due to the grooves 527 and 528 and the through-hole 529 arranged in the radial direction of the heat shield 201, the body portion 521 acts as a plate spring. The grooves 527 and 528 and the through-hole 529 may each pass through the body portion 521 in the direction from the EUV collector mirror 23 side toward the IF 292 side.

The grooves 527 and 528 and the through-hole 529 may pass through the body portion 521 from the bottom surface 551 to the surface on the opposite side thereof. As shown in FIG. 5B, the groove 527 may be a groove formed in a body portion side surface 553. The groove 528 may be a groove that is formed on the opposite surface to the side surface 553. The through-hole 529 may be a through-hole that is exposed on the bottom surface 551 of the body portion 521 and on the surface opposite thereto, but that is not exposed on other surfaces. The grooves 527 and 528 and the through-hole 529 may be formed by performing a cutting process on the body portion 521, for example.

As the heat shield 201 thermally deforms due to radiant light from the plasma, scattered laser light, or the like, the body portions of the support portions 501 to 503 (the absorbing portions) can expand/contract in the radial direction of the heat shield 201. As a result, stress caused by the thermal deformation in the heat shield 201 can be absorbed, and a resulting force that is transmitted to the chamber receptacle 2 can be reduced.

Note that the method for anchoring the support portions 501 to 503 may be a method that is different from using anchoring screws, as in the second embodiment. The heat shield 201 may be supported by four or more support portions, including the support portions 501 to 503, that are anchored to positions along the same circle. Only some of the grooves 527 and 528 and the through-hole 529 may be formed in the body portion 521. For example, only the groove 527 and the groove 528 may be formed.

5.4 Fourth Embodiment

Figure 6A:
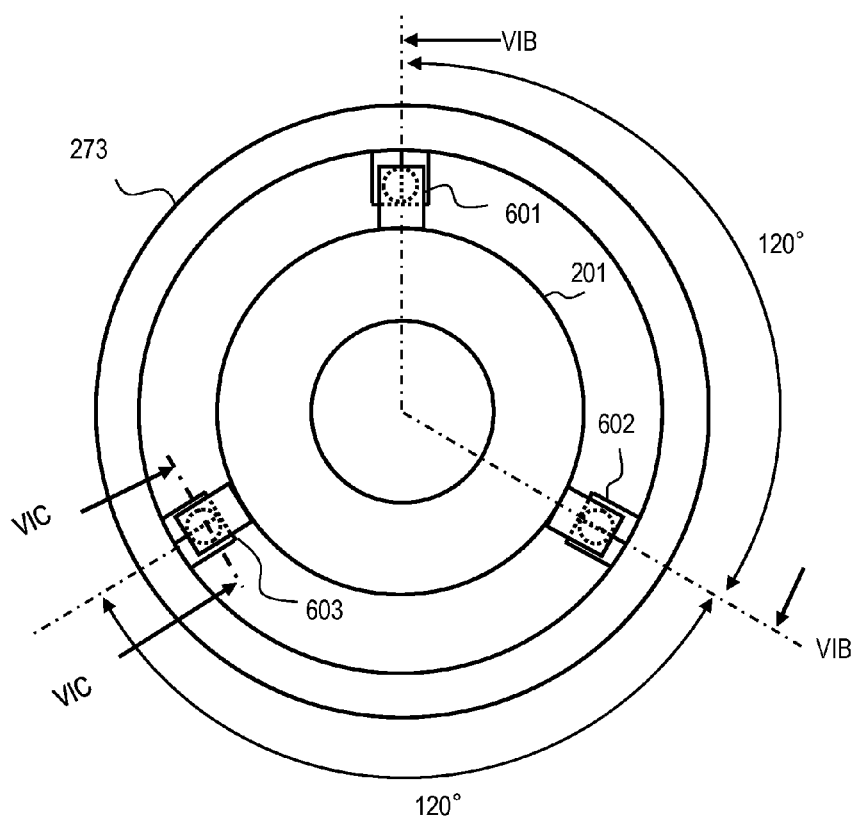
FIG. 6A schematically illustrates the configuration of a chamber according to a fourth embodiment.
Figure 6B:
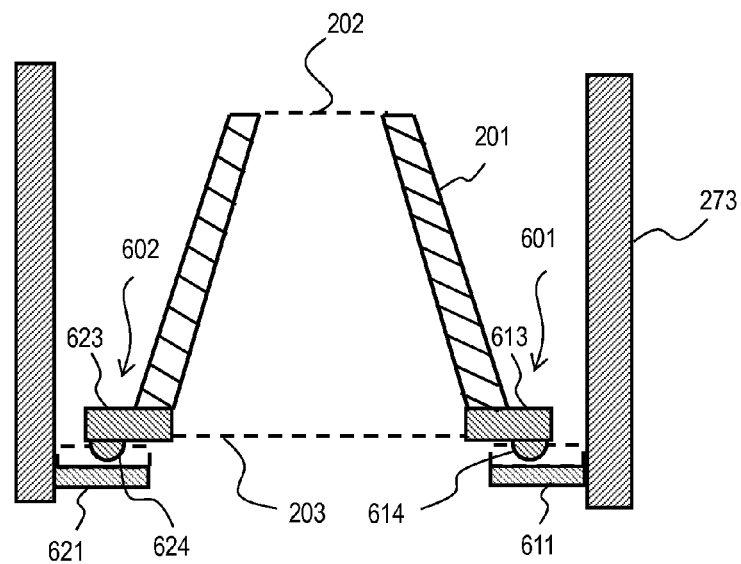
FIG. 6B is a cross-sectional view taken along a VIB-VIB cutting line shown in FIG. 6A.
Figure 6C:
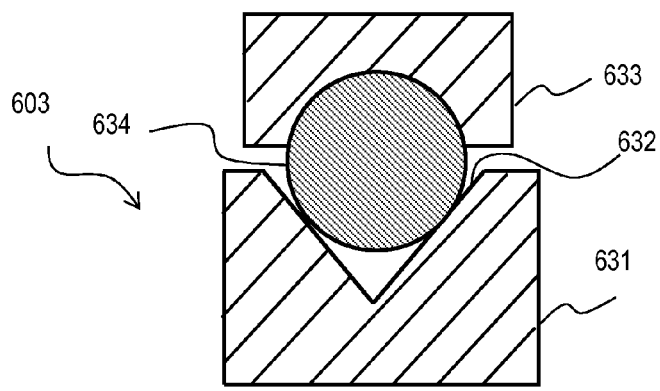
FIG. 6C is a cross-sectional view taken along a VIC-VIC cutting line shown in FIG. 6A.

FIGS. 6A to 6C schematically illustrate a chamber configuration according to a fourth embodiment. FIG. 6A illustrates the configuration as seen from the side on which the IF 292 is located, whereas FIG. 6B is a cross-sectional view of the chamber taken along a cutting line VIB-VIB shown in FIG. 6A. FIG. 6C is a cross-sectional view of a support portion taken along a cutting line VIC-VIC shown in FIG. 6A. The following descriptions will focus primarily on points that are different from the configuration having been described with reference to FIGS. 4A and 4B.

As shown in FIG. 6A, the heat shield 201 may be supported by three support portions 601 to 603. The positions at which the support portions 601 to 603 are anchored to the heat shield 201 may be the same in the cylinder center axis direction on an end surface of the heat shield 201 located toward the EUV collector mirror 23 (that is, a bottom end surface). As another example, the positions on the outer circumferential surface of the heat shield 201 to which the support portions 601 to 603 are anchored may be positions that oppose the chamber receptacle side wall 273.

As shown in FIG. 6A, the three support portions 601 to 603 may be anchored to the heat shield 201 at equal intervals (120°) along the circumferential direction of the heat shield 201. The heat shield 201 can be supported in a stable manner as a result. Meanwhile, the support portions 601 to 603 may be anchored to the inner surface of the side wall 273 of the chamber receptacle 2 at equal intervals along the circumferential direction thereof. However, the support portions 601 to 603 may be anchored to the heat shield 201 and/or the chamber receptacle 2 at intervals that are not equal in the circumferential directions thereof.

As shown in FIG. 6B, the support portion 601 may include a rail 611, a ball holding portion 613, and a ball 614. One end of the rail 611 may be anchored to the inner surface of the chamber receptacle 2, and may extend from the inner surface of the chamber receptacle 2 toward the heat shield 201. The rail 611 may extend in the radial direction of the heat shield 201.

The ball holding portion 613 may hold the ball 614, and the ball 614 may be anchored to the ball holding portion 613. One end of the ball holding portion 613 may be anchored to the heat shield 201, and the ball holding portion 613 may extend toward the chamber receptacle 2. A leading end of the ball holding portion 613 may be positioned before the chamber receptacle 2, without reaching the chamber receptacle 2.

As will be described later, a groove may be formed in the rail 611, and that groove may extend in the same direction as the rail 611. In other words, the groove may extend in the radial direction of the heat shield 201. The ball 614 may be held within the rail 611 being sandwiched between the ball holding portion 613 and the rail 611. The ball 614 may serve as a contact portion that makes contact with an inner surface of the groove.

The ball holding portion 613 and the ball 614 may simply be disposed upon the rail 611, and may not be confined in the direction toward the IF 292 (that is, the upward direction). Although the ball 614 is supported by the inner surface of the groove, the ball 614 is not held by the rail 611, and may be capable of freely moving along the groove (in the radial direction of the heat shield) while making contact with the inner surface of the groove.

The support portions 602 and 603 may have the same configuration as the support portion 601. As shown in FIG. 6B, the support portion 602 may include a rail 621, a ball holding portion 623, and a ball 624, and these elements may correspond to the rail 611, the ball holding portion 613, and the ball 614, respectively.

FIG. 6C is a cross-sectional view schematically illustrating the configuration of the support portion 603. As described above, the support portions 601 and 602 may have the same configuration as the support portion 603. The support portion 603 may include a rail 631, a ball holding portion 633, and a ball 634. The ball holding portion 633 and the ball 634 may be formed as a single entity from the same material, or the ball holding portion 633 and the ball 634 may be anchored to each other after being formed as separate entities.

A V-shaped groove 632 may be formed in the rail 631. The ball 634 may make contact with an inner surface of the V-shaped groove 632 at two points of contact. The V-shaped groove 632 may extend in the radial direction of the heat shield 201. The ball 634 may be capable of moving along the inside of the V-shaped groove 632 while making point contact with the inner surface of the V-shaped groove 632.

As the heat shield 201 thermally expands due to radiant light from the plasma, scattered laser light, or the like, the balls 614, 624, and 634 may move within the V-shaped grooves in the rails 611, 621, and 631, respectively, toward the chamber receptacle 2. On the other hand, as the heat shield 201 contracts, the balls 614, 624, and 634 may move within the V-shaped grooves in the rails 611, 621, and 631, respectively, toward the heat shield 201.

In this manner, the support portions 601 to 603 may expand/contract in accordance with the deformation in the heat shield 201. As a result, the support portions 601 to 603 can absorb stress caused by the thermal deformation in the heat shield 201, and a resulting force that is transmitted to the chamber receptacle 2 can be reduced. The contact portions that make contact with the inner surfaces of the grooves make point contact with the inner surfaces of the grooves at spherical surfaces of the balls 614, 624, and 634, and thus a smooth relative movement is possible. The curvature radius of the spherical surfaces may not be constant.

Figure 7A:
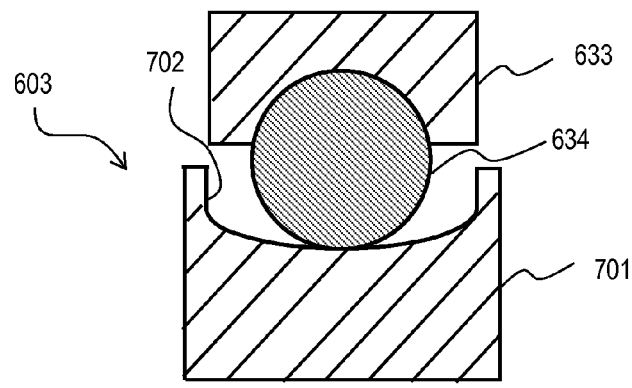
FIG. 7A schematically illustrates another configuration of a support portion according to the fourth embodiment.
Figure 7B:
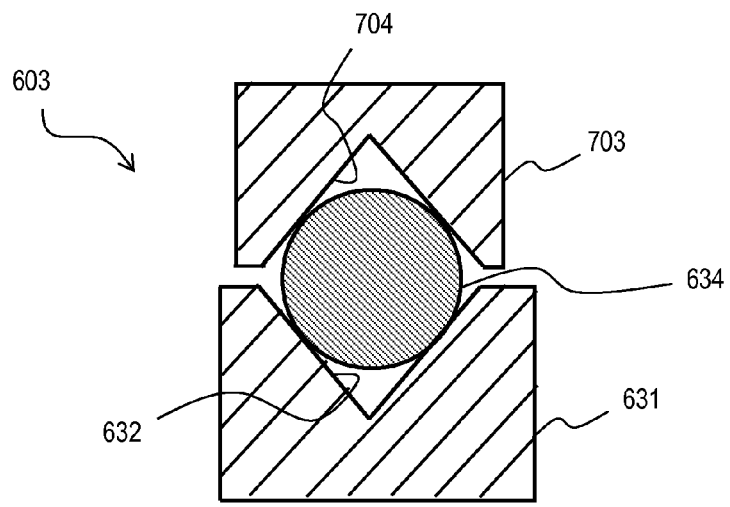
FIG. 7B schematically illustrates another configuration of a support portion according to the fourth embodiment.

FIGS. 7A and 7B illustrate variations on the support portion 603 illustrated in FIGS. 6A to 6C. The following descriptions will focus primarily on points that are different from the configurations illustrated in FIGS. 6A to 6C. As shown in FIG. 7A, the support portion 603 may include a rail 701 that has a U-shaped groove 702 and that is anchored to the chamber receptacle 2, instead of the rail 631 in which the V-shaped groove is formed. The ball 634 may make contact with the inner surface of the U-shaped groove 702 at a single point.

As shown in FIG. 7B, the support portion 603 may include a second rail 703 in which a V-shaped groove 704 is formed, instead of the ball holding portion 633. The second rail 703 may be anchored to the heat shield 201, and the direction in which the V-shaped groove 704 extends may be the same as the direction in which the V-shaped groove 632 of the rail 631 extends. The ball 634 may not be anchored to the second rail 703, and may be capable of moving along the V-shaped groove 704. The ball 634 may make contact with an inner surface of the V-shaped groove 704 at two points of contact.

In the configurations illustrated in FIGS. 6C and 7A, the rails 631 and 701 may be anchored to the heat shield 201, and the ball holding portions 633 may be anchored to the chamber receptacle 2. As the heat shield 201 thermally deforms, the rails 631 and 701 may move upon the ball 634 whose position is fixed. In this manner, the ball 634 can move relative to the rails 631 and 701 even if the positions of the rails 631 and 701 or the position of the ball 634 is fixed. The contact surface of the contact portion (the ball 634, in the above example) that experiences the relative movement within the groove may have a shape that is different from a spherical surface shape, and the contact between the contact portion and the inner surface of the groove may be line contact or surface contact.

5.5 Fifth Embodiment

In the chamber, the support portion of the heat shield 201 may include the absorbing portion that absorbs stress produced by thermal deformation in the heat shield 201 by expanding/contracting, as in the aforementioned first to fourth embodiments. However, the heat shield 201 may include slots that absorb stress produced by thermal deformation in the heat shield 201 by expanding/contracting, as in the embodiments described hereinafter. The "slots" include slits that pass from the inner surface to the outer surface of the heat shield 201 (see fifth embodiment) and grooves formed in the inner surface or outer surface of the heat shield 201 (see sixth and seventh embodiments).

Figure 8A:
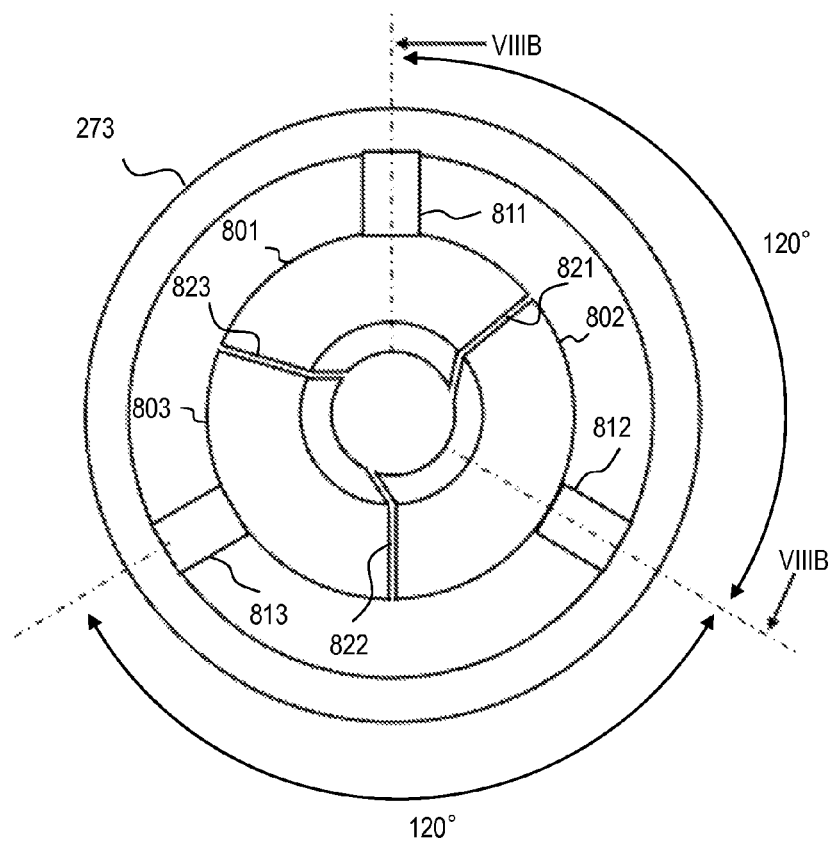
FIG. 8A schematically illustrates the configuration of a chamber according to a fifth embodiment.
Figure 8B:
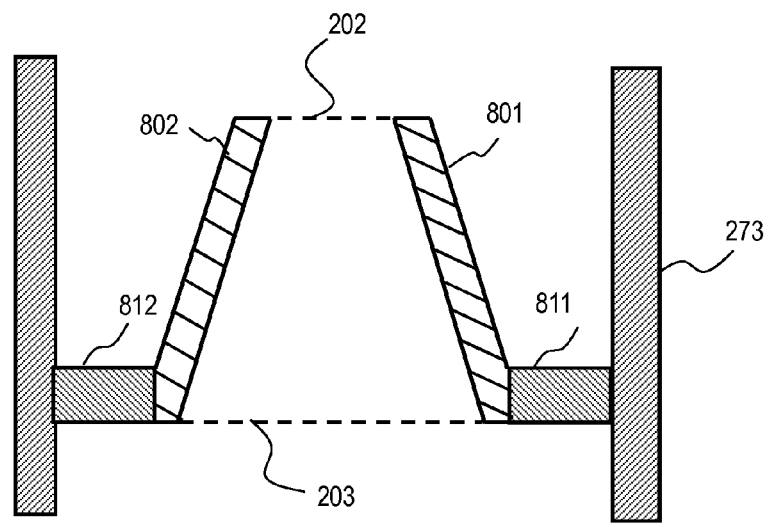
FIG. 8B is a cross-sectional view taken along a VIIIB-VIIIB cutting line shown in FIG. 8A.

FIGS. 8A and 8B schematically illustrate a chamber configuration according to a fifth embodiment. FIG. 8A illustrates the configuration as seen from the side on which the IF 292 is located, whereas FIG. 8B is a cross-sectional view taken along a cutting line VIIIB-VIIIB shown in FIG. 8A.

As shown in FIG. 8, the cylindrical heat shield 201 may be configured of a plurality of portions 801 to 803 divided in the circumferential direction by slits 821 to 823. The plurality of portions (material portions) 801 to 803 may have the same shape. The plurality of portions 801 to 803 may be anchored to the inner surface of the chamber receptacle side wall 273 by respective support portions 811 to 813. The support portions 811 to 813 may be anchored to the heat shield 201 at equal intervals (120°) along the circumferential direction thereof. The support portions 811 to 813 may be anchored to the chamber receptacle 2 at equal intervals (120°) along the circumferential direction thereof.

The support portions 811 to 813 may be anchored to the heat shield 201 and the chamber receptacle side wall 273. The support portions 811 to 813 may be metal columns, for example, and may not expand/contract in order to absorb thermal deformation in the heat shield 201. The support portions 811 to 813 may have expanding/contracting configurations as described in other embodiments.

The heat shield 201 may include the slit 821 provided between the portion 801 and the portion 802, the slit 822 provided between the portion 802 and the portion 803, and the slit 823 provided between the portion 803 and the portion 801.

The slits 821 to 823 may have the same shape. The slits 821 to 823 may extend from the outer circumferential surface of the heat shield 201 to the inner circumferential surface of the heat shield 201, and may further extend from the end of the heat shield 201 on the IF 292 side (the upper-end hole 202) to the end on the EUV collector mirror 23 side (the lower-end hole 203).

As shown in FIG. 8A, the directions in which the slits 821 to 823 pass through the heat shield 201 from the outer circumferential surface to the inner circumferential surface thereof may be tilted or bent against the radial direction from the center axis of the heat shield 201. Through this, the amount of light that reaches the chamber receptacle 2 from the plasma generation region 25 through the slits 821 to 823 can be reduced.

As the heat shield 201 expands, the widths of the slits 821 to 823 may contract in the circumferential direction. Meanwhile, as the heat shield 201 contracts, the widths of the slits 821 to 823 may expand in the circumferential direction. As a result, the slits 821 to 823 can absorb stress caused by the thermal deformation in the heat shield 201, and a resulting force that is transmitted to the chamber receptacle 2 via the support portions 811 to 813 can be reduced.

As described in the present embodiment, the heat shield 201 may include one or more slots that expand/contract in response to thermal deformation in the heat shield 201. As another example, the heat shield 201 may include one, two, or four or more slits.

5.6 Sixth Embodiment

Figure 9A:
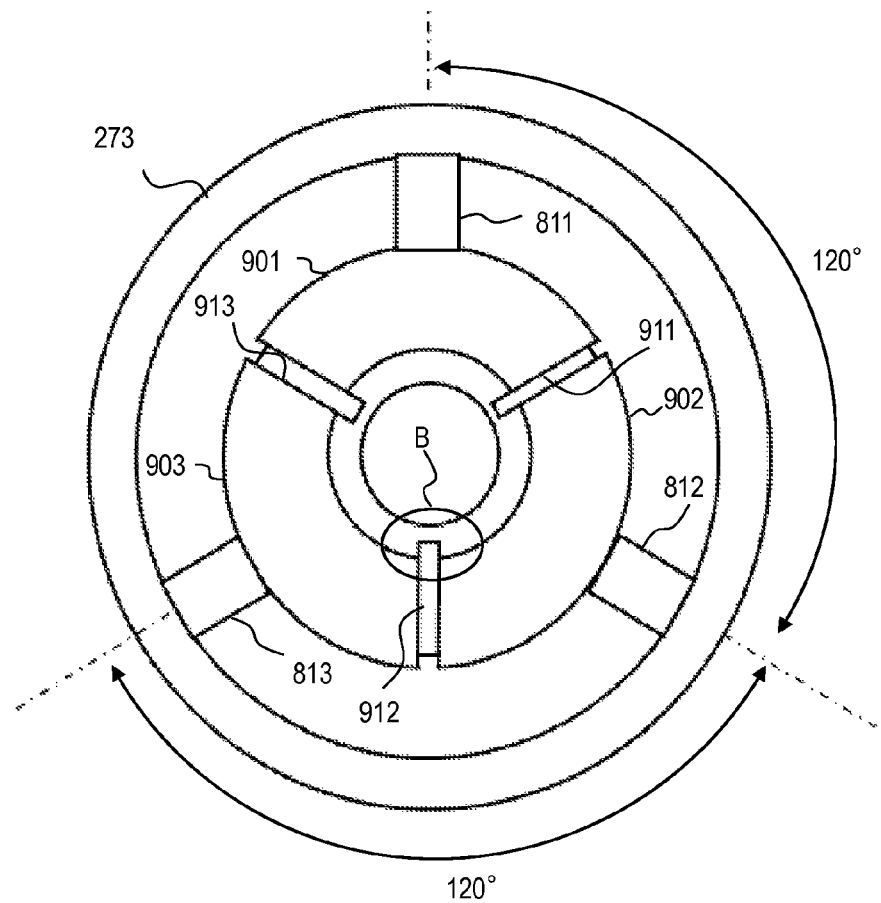
FIG. 9A schematically illustrates the configuration of a chamber according to a sixth embodiment.
Figure 9B:
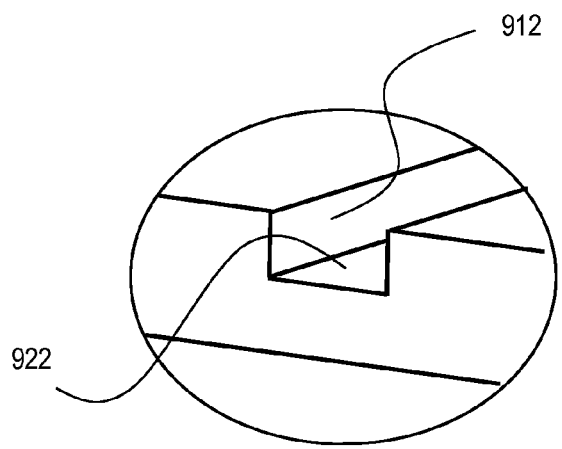
FIG. 9B illustrates an area in FIG. 9A within a circle B in an enlarged manner.

FIGS. 9A and 9B schematically illustrate a chamber configuration according to a sixth embodiment. FIG. 9A illustrates the configuration as seen from the side on which the IF 292 is located, whereas FIG. 9B illustrates an area in FIG. 9A within a circle B in an enlarged manner. The following will primarily describe differences from the fifth embodiment having been described with reference to FIGS. 8A and 8B.

As shown in FIGS. 9A and 9B, the heat shield 201 may include grooves (groove holes) 911 to 913 instead of the slits 821 to 823 of the fifth embodiment. The grooves and slits are both included in the slots. The grooves 911 to 913 may be formed in the heat shield 201 at equal intervals (120°) along the circumferential direction of the heat shield 201. The support portions 811 to 813 may be respectively anchored to a portion 901 provided between the groove 913 and the groove 911, a portion 902 provided between the groove 911 and the groove 912, and a portion 903 provided between the groove 912 and the groove 913.

The grooves 911 to 913 may be formed in the outer circumferential surface of the heat shield 201. The grooves 911 to 913 may have the same shape. The grooves 911 to 913 may extend linearly from the upper end of the heat shield 201 (the end located toward the IF 292) to the lower end of the heat shield 201 (the end located toward the EUV collector mirror 23).

As shown in FIG. 9B, the groove 912 may be formed so as not to pass through the heat shield 201 from the outer circumferential surface thereof to the inner circumferential surface thereof, and a thin section 922 may be present in the base of the groove 912. The thin section 922 may be thinner than the portions 901 to 903, on the outer sides of the groove 912, in which other grooves are not formed. The thickness may correspond to the length of the heat shield 201 in the radial direction. The grooves 911 and 913 may have the same shape as the groove 912 illustrated in FIG. 9B.

As the heat shield 201 expands, the grooves 911 to 913 and the thin sections formed in the bases thereof may contract in the circumferential direction. Meanwhile, as the heat shield 201 contracts, the grooves 911 to 913 and the thin sections formed in the bases thereof may expand in the circumferential direction. As a result, the grooves 911 to 913 and the thin sections formed in the bases thereof can absorb stress caused by the thermal deformation in the heat shield 201, and a resulting force that is transmitted to the chamber receptacle 2 via the support portions 811 to 813 can be reduced.

The heat shield 201 may include one, two, or four or more grooves. The shape of the grooves is not limited to that shown in FIGS. 9A and 9B. For example, the grooves may extend from the upper end of the heat shield 201 to the lower end of the heat shield 201 while curving or bending. The bottom surface of the grooves may be curved instead of being a flat surface as in the aforementioned example. For example, the grooves may be U-shaped grooves. The grooves may have respectively different shapes. Furthermore, the grooves 911 to 913 may be formed in the inner circumferential surface of the heat shield 201.

5.7 Seventh Embodiment

Figure 10:
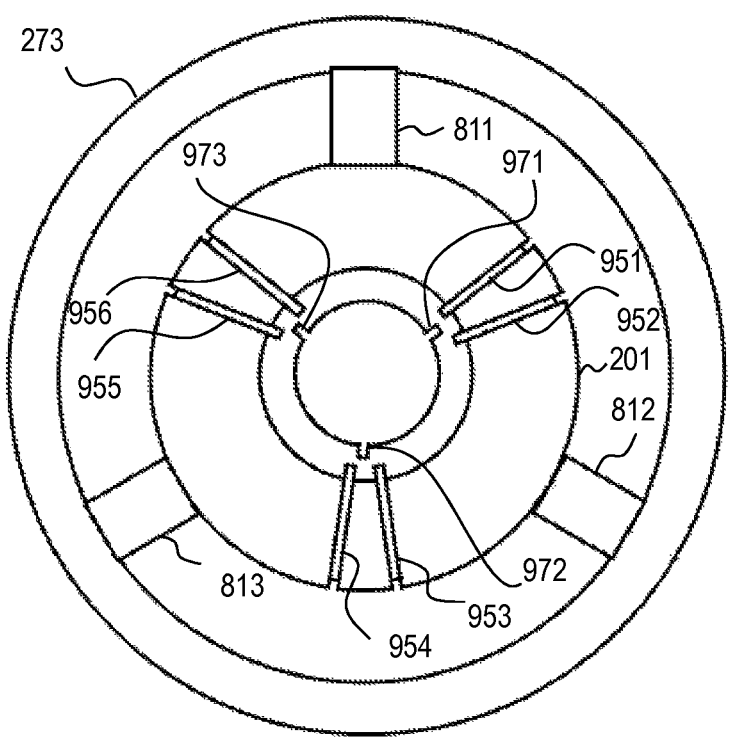
FIG. 10 schematically illustrates the configuration of a chamber according to a seventh embodiment.

FIG. 10 schematically illustrates a chamber configuration according to a seventh embodiment. FIG. 10 illustrates the configuration as seen from the side on which the IF 292 is located. The following will primarily describe differences from the sixth embodiment having been described with reference to FIGS. 9A and 9B.

As shown in FIG. 10, grooves may be formed in the outer circumferential surface and the inner circumferential surface of the heat shield 201. For example, as shown in FIG. 10, grooves 951 to 956 may be formed in the outer circumferential surface of the heat shield 201, whereas grooves 971 to 973 may be formed in the inner circumferential surface of the heat shield 201.

The groove 971 may be formed between the grooves 951 and 952 in the circumferential direction of the heat shield 201. The groove 972 may be formed between the grooves 953 and 954 in the circumferential direction of the heat shield 201. The groove 973 may be formed between the grooves 955 and 956 in the circumferential direction of the heat shield 201. The grooves 971 to 973 may be formed at equal intervals in the circumferential direction of the heat shield 201. The grooves 952, 954, and 956 may be formed at equal intervals in the circumferential direction of the heat shield 201. The grooves 951, 953, and 955 may be formed at equal intervals in the circumferential direction of the heat shield 201.

The grooves 951 to 956 and 971 to 973 may have the same shapes as the grooves described in the sixth embodiment. The movement and effects of the grooves 951 to 956 and 971 to 973 during thermal deformation of the heat shield 201 may be the same as those of the grooves described in the sixth embodiment.

Figure 11:
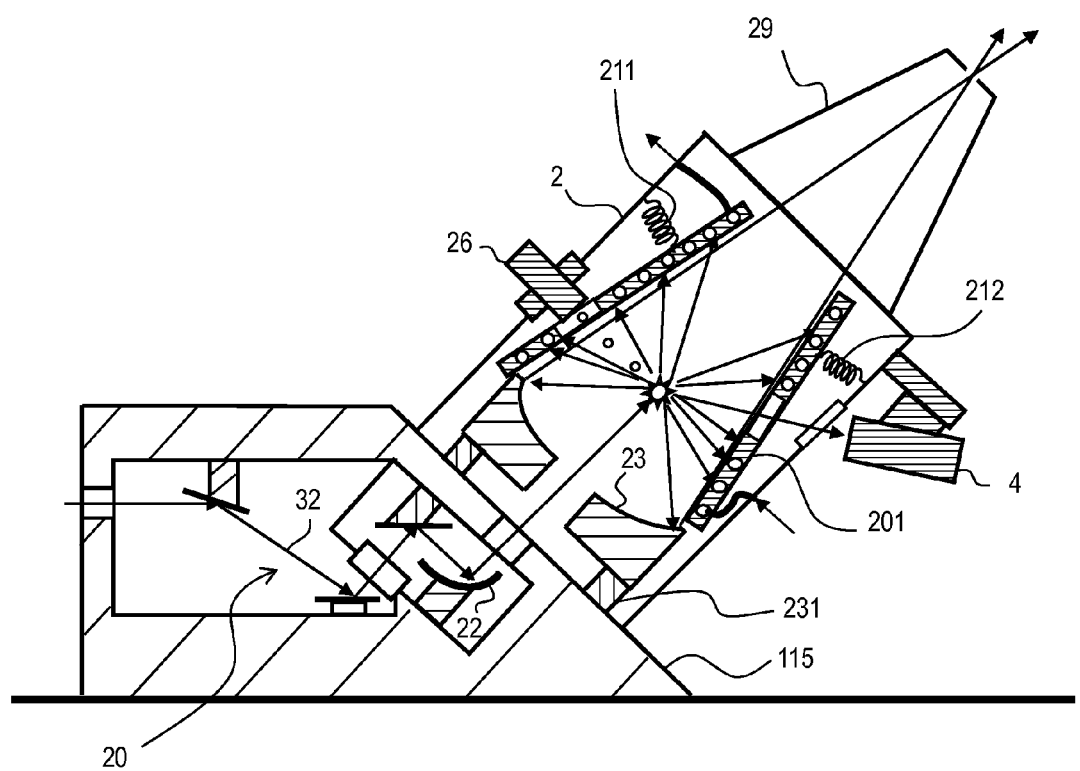
FIG. 11 illustrates the overall configuration of another exemplary LPP type EUV light generation apparatus.

6. Other Configuration Example of EUV Light Generation Apparatus Including Heat Shield FIG. 11 is a cross-sectional view schematically illustrating another example of the configuration of an EUV light generation apparatus to which the present invention can be applied. The following descriptions will focus primarily on points that are different from the configuration illustrated in FIG. 2. As shown in FIG. 11, the target sensor 4 may be attached to the chamber receptacle 2 on the opposite side to the side on which the target supply device 26 is attached. As shown in FIG. 11, the chamber wall 271 may be omitted from the chamber receptacle 2.

The EUV collector mirror 23 may be supported by a different component from the chamber receptacle 2, such as the support platform 115, for example. The holder 231 that holds the EUV collector mirror 23 may be anchored to the support platform 115.

A laser beam focusing optical system 20 that includes the laser beam focusing mirror 22 may be disposed outside the chamber receptacle 2, and may be supported by a different component from the chamber receptacle 2. For example, the laser beam focusing optical system 20 may be supported within the support platform 115.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A chamber used in an extreme ultraviolet light generation apparatus that generates extreme ultraviolet light by irradiating a target material with a laser beam, the chamber comprising:
   a chamber receptacle;
   a heat shield, disposed within the chamber receptacle between a predetermined region where the target material turns into plasma and the chamber receptacle, configured to absorb heat produced at the predetermined region when the target material turns into plasma; and
   a support portion configured to attach the heat shield to the chamber receptacle,
   the support portion and the heat shield being separated from, and independent of, each other,
   the support portion including an elastic member configured to absorb stress produced in the heat shield deforming due to the heat, by elastically deforming in response to the thermal deformation of the heat shield.

2. The chamber according to claim 1, further comprising a plurality if support portions including the support portion,
   wherein each of the plurality of support portions includes an elastic member configured to absorb the stress produced in the heat shield deforming due to the heat by elastically deforming in response to the thermal deformation of the heat shield.

3. The chamber according to claim 1,
   wherein the elastic member is a plate spring.

4. The chamber according to claim 3, wherein
   the elastic member includes a body portion; and
   the body portion includes a plurality of grooves arranged in a radial direction of the heat shield and passing through the body portion.

5. An extreme ultraviolet light generation apparatus comprising:
the chamber according to claim 1;
a target supply device configured to supply the target material to a predetermined region in the chamber;
a laser beam focusing optical system configured to turn the target material into plasma by focusing a laser beam on the target material supplied to the predetermined region by the target supply device; and
a collector mirror configured to reflect and focus extreme ultraviolet light radiated from the plasma.

6. A chamber used in an extreme ultraviolet light generation apparatus that generates extreme ultraviolet light by irradiating a target material with a laser beam, the chamber comprising:
a chamber receptacle;
a heat shield, disposed within the chamber receptacle between a predetermined region where the target material turns into plasma and the chamber receptacle, configured to absorb heat produced at the predetermined region when the target material turns into plasma; and
a plurality of support portions configured to attach the heat shield to the chamber receptacle,
the heat shield being cylindrical in shape and extending from an entry side of the laser beam to an output side of the extreme ultraviolet light; and
the heat shield including a slot that extends from one end of the heat shield to the other end of the heat shield and that is configured to expand/contract in response to the thermal deformation of the heat shield,
wherein the heat shield includes a plurality of slits that extend from the one end of the heat shield to the other end of the heat shield and that are configured to expand/contract in response to the thermal deformation of the heat shield;
the heat shield is divided into a plurality of portions by the plurality of slits; and
the plurality of portions resulting from the division are attached to the chamber receptacle by plurality of support portions, respectively.

7. An extreme ultraviolet light generation apparatus comprising:
the chamber according to claim 6;
a target supply device configured to supply the target material to a predetermined region in the chamber;
a laser beam focusing optical system configured to turn the target material into plasma by focusing a laser beam on the target material supplied to the predetermined region by the target supply device; and
a collector mirror configured to reflect and focus extreme ultraviolet light radiated from the plasma.

* * * * *